(12) United States Patent
Tanaka et al.

(10) Patent No.: US 12,108,635 B2
(45) Date of Patent: Oct. 1, 2024

(54) DISPLAY DEVICE

(71) Applicant: Samsung Display Co., Ltd., Yongin-Si (KR)

(72) Inventors: Tetsuhiro Tanaka, Hwaseong-si (KR); Jung Yub Seo, Cheonan-si (KR); Ki Seong Seo, Seoul (KR); Yeong Gyu Kim, Seoul (KR); Hee Won Yoon, Cheonan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 399 days.

(21) Appl. No.: 17/348,179

(22) Filed: Jun. 15, 2021

(65) Prior Publication Data

US 2022/0005901 A1 Jan. 6, 2022

(30) Foreign Application Priority Data

Jul. 2, 2020 (KR) .................. 10-2020-0081270

(51) Int. Cl.
  *H01L 27/32* (2006.01)
  *H01L 29/786* (2006.01)
  *H10K 59/124* (2023.01)

(52) U.S. Cl.
  CPC ..... *H10K 59/124* (2023.02); *H01L 29/78618* (2013.01); *H01L 29/7869* (2013.01); *H01L 29/78696* (2013.01)

(58) Field of Classification Search
  CPC ............... H10K 59/124; H10K 59/12; H10K 50/00–868; H10K 2101/40; H10K 2101/10; H10K 2101/27; H10K 2101/90; H10K 2101/00; H10K 2101/30; H10K 2101/50; H10K 30/865;
  (Continued)

(56) References Cited

U.S. PATENT DOCUMENTS 10,381,219 B1 * 8/2019 Ueda .................. H01L 21/0234
11,063,068 B2 7/2021 Jeon et al.
(Continued)

FOREIGN PATENT DOCUMENTS

JP 2006-261252 A 9/2006
JP 2016-111203 A 6/2016
(Continued)

*Primary Examiner* — Cuong B Nguyen
*Assistant Examiner* — Anthony A Pulatov
(74) *Attorney, Agent, or Firm* — Innovation Counsel LLP

(57) ABSTRACT

A display device comprises a base substrate, a lower interlayer dielectric layer, an oxide semiconductor layer including a first channel region, a first drain region disposed on one side of the first channel region, and a first source region, a first gate insulating layer, a first upper gate electrode, an upper interlayer dielectric layer, and a first source electrode and a first drain electrode, wherein the lower interlayer dielectric layer includes a first lower interlayer dielectric layer disposed on the base substrate, and a second lower interlayer dielectric layer disposed on the first lower interlayer dielectric layer, wherein the first lower interlayer dielectric layer includes silicon nitride and the second lower interlayer dielectric layer comprises silicon oxide, and wherein a composition ratio of nitrogen to silicon in the first lower interlayer dielectric layer ranges from 0.8 to 0.89.

19 Claims, 16 Drawing Sheets

(58) Field of Classification Search
CPC ..... H10K 85/00–791; H10K 59/00–18; H10K 59/121–1216; H10K 59/127–1275; H10K 59/125; H10K 2102/301–331; H10K 2102/341; H10K 2102/351; H10K 2102/361; H10K 70/00; H10K 71/831–861; H10K 71/00; H10K 77/10–111; H01L 29/78618; H01L 29/7869; H01L 29/4908; H01L 29/66742–6678; H01L 29/786–78696; H01L 29/04–045; H01L 29/16–1608; H01L 29/18–185; H01L 29/22–2206; H01L 29/36–365; H01L 27/1214–1296; H01L 27/12–13

See application file for complete search history.

(56) References Cited

U.S. PATENT DOCUMENTS

| | | | | |
|---|---|---|---|---|
| 2004/0121146 A1* | 6/2004 | He | ............................ | C08J 7/048 |
| | | | | 428/480 |
| 2016/0141551 A1* | 5/2016 | Seo | ..................... | H10K 50/8445 |
| | | | | 257/40 |
| 2018/0061868 A1* | 3/2018 | Na | ....................... | H01L 29/7869 |
| 2019/0333752 A1* | 10/2019 | Carruthers | .......... | H01L 27/1262 |
| 2020/0066765 A1 | 2/2020 | Cho et al. | | |
| 2020/0098933 A1* | 3/2020 | Tanaka | ..................... | H01L 29/24 |
| 2021/0005693 A1* | 1/2021 | Cho | .................... | H10K 59/1201 |
| 2021/0013245 A1* | 1/2021 | Tanaka | ................. | H01L 27/1251 |
| 2021/0257426 A1 | 8/2021 | Tanaka et al. | | |
| 2021/0327923 A1* | 10/2021 | Suzuki | .............. | H01L 21/02631 |
| 2023/0071179 A1* | 3/2023 | Seo | ..................... | H01L 27/1214 |

FOREIGN PATENT DOCUMENTS

| | | |
|---|---|---|
| JP | 2019-129281 A | 8/2019 |
| JP | 2020-031206 A | 2/2020 |
| JP | 2020-076975 A | 5/2020 |
| KR | 10-1561804 B1 | 10/2015 |
| KR | 10-2018-0005580 A | 1/2018 |
| KR | 10-2019-0098311 A | 8/2019 |
| KR | 10-2021-0104213 A | 8/2021 |

* cited by examiner

FIG. 11

| (mm) | SUBSTRATE #3 | SUBSTRATE #4 |
|---|---|---|
| Avg | 538.18 | 528.02 |
| Max | 658.97 | 643.26 |

FIG. 12

| I-V CURVE | | TRANSISTOR #1 | TRANSISTOR #2 |
|---|---|---|---|
| I-V (3/3.5) | | | |
| Vth (V) | AVG | -0.19 | -0.07 |
| | 4σ | 1.21 | 0.81 |
| Ion (A) | AVG | 18.89 | 17.53 |
| | 4σ | 12.47 | 9.36 |

FIG. 13

| NBTS | TRANSISTOR #1 | TRANSISTOR #2 |
|---|---|---|
| 0.10<br>0.05<br>0.00<br>-0.05<br>-0.10 | | |
| UniqueCount | 4 | 4 |
| Median | -0.01 | -0.02 |
| Avg | -0.01 | -0.02 |
| Max | 0.00 | -0.02 |
| Min | -0.03 | -0.03 |
| StdDev | 0.01 | 0.01 |

FIG. 15

| 70°C | TRANSISTOR #1 | TRANSISTOR #2 |
|---|---|---|
| 0.1<br>0.05<br>0<br>-0.05<br>-0.1 | | |
| UniqueCount | 6 | 3 |
| Median | 0.15 | 0.20 |
| Avg | 0.13 | 0.19 |
| Max | 0.22 | 0.22 |
| Min | 0.03 | 0.15 |
| StdDev | 0.08 | 0.03 |

DISPLAY DEVICE

CROSS-REFERENCE TO RELATED APPLICATION

This application claims priority to and benefit of Korean Patent Application No. 10-2020-0081270 filed on Jul. 2, 2020, in the Korean Intellectual Property Office, the disclosure of which is incorporated herein by reference in its entirety.

BACKGROUND

1. Field of the Disclosure

The present disclosure relates to a display device. More particularly, the present disclosure relates to a display device capable of preventing warpage of a substrate.

2. Description of the Related Art

Due to the recent evolution of the information-oriented society, various demands for display devices to display moving and non-moving images are ever increasing. Display devices include liquid-crystal displays (LCDs), plasma display panels (PDPs), organic light-emitting displays (OLEDs), and micro light-emitting diode displays, etc.

A display device may include light-emitting diodes and a plurality of thin-film transistors connected to the light-emitting diodes. The plurality of thin-film transistors may include a thin-film transistor including polycrystalline silicon and a thin-film transistor including oxide. A thin-film transistor containing polycrystalline silicon may have an advantage in that it can supply driving current stably. A thin-film transistor containing oxide may have advantages in that it can be turned on quickly and exhibits good off-current characteristics. However, there is still need to develop a novel display device which can prevent warpage of a substrate so that the display device can improve display quality and reduce energy consumption.

SUMMARY

Aspects of the present disclosure provide a display device having improved device characteristics of a thin-film transistor including an oxide.

Aspects of the present disclosure also provide a display device capable of preventing warpage of a substrate.

It should be noted that objects of the present disclosure are not limited to the above-mentioned object; and other objects of the present disclosure will be apparent to those skilled in the art from the following descriptions.

According to the example embodiments of the present disclosure, it is possible to reduce a compressive stress of a first lower interlayer dielectric layer in a display device by adjusting the composition ratio of nitrogen to silicon and the layer density of the first lower interlayer dielectric layer. By doing so, it is possible to prevent warpage of the base substrate on which the first lower interlayer dielectric layer is formed.

In addition, according to the example embodiments of the present disclosure, characteristics of a transistor including an oxide semiconductor layer can be maintained or improved.

It should be noted that effects of the present disclosure are not limited to those described above and other effects of the present disclosure will be apparent to those skilled in the art from the following descriptions.

According to an embodiment of the present disclosure, a display device comprises a base substrate, a lower interlayer dielectric layer disposed on the base substrate, an oxide semiconductor layer disposed on the lower interlayer dielectric layer and comprising a first channel region, a first drain region located on one side of the first channel region, and a first source region located on an opposite side of the first channel region, a first gate insulating layer disposed on the oxide semiconductor layer, a first upper gate electrode disposed on the first gate insulating layer, an upper interlayer dielectric layer disposed on the first upper gate electrode, and a first source electrode and a first drain electrode disposed on the upper interlayer insulating layer, wherein the lower interlayer dielectric layer comprises a first lower interlayer dielectric layer disposed on the base substrate, and a second lower interlayer dielectric layer disposed on the first lower interlayer dielectric layer, wherein the first lower interlayer dielectric layer comprises silicon nitride and the second lower interlayer dielectric layer comprises silicon oxide, and wherein a composition ratio of nitrogen to silicon in the first lower interlayer dielectric layer ranges from 0.8 to 0.89.

In an example embodiment, the first lower interlayer dielectric layer has a layer density of 2.4 $g/cm^3$ to 2.57 $g/cm^3$.

In an example embodiment, a hydrogen concentration of the first lower interlayer dielectric layer is equal to or less than 1.26E+22 $atoms/cm^3$.

In an example embodiment, a compressive stress of the first lower interlayer dielectric layer ranges from −300 MPa to 0 MPa.

In an example embodiment, a thickness of the first lower interlayer dielectric layer ranges from 300 Å to 2,000 Å.

In an example embodiment, a thickness of the second lower interlayer dielectric layer ranges from 500 Å to 4,000 Å.

In an example embodiment, the thickness of the first lower interlayer dielectric layer is smaller than the thickness of the second lower interlayer dielectric layer.

In an example embodiment, the second lower interlayer dielectric layer is disposed directly on the first lower interlayer dielectric layer, and wherein the oxide semiconductor layer is disposed directly on the second lower interlayer dielectric layer.

In an example embodiment, the display device further comprises a first connection electrode disposed on the upper interlayer dielectric layer and connected to the first upper gate electrode, wherein the first connection electrode is disposed on the same layer as the first source electrode.

In an example embodiment, the display device further comprises a first lower gate electrode disposed between the base substrate and the lower interlayer dielectric layer, wherein the first lower gate electrode overlaps the first upper gate electrode.

In an example embodiment, the display device further comprises a capacitor electrode disposed on the same layer as the first lower gate electrode and spaced apart from the first lower gate electrode, an upper gate insulating layer disposed between the capacitor electrode and the base substrate, and a second gate electrode disposed between the upper gate insulating layer and the base substrate, wherein the second gate electrode overlaps the capacitor electrode.

In an example embodiment, the display device further comprises a lower gate insulating layer disposed between the second gate electrode and the base substrate, and a polycrystalline silicon semiconductor layer disposed between the lower gate insulating layer and the base substrate, wherein the polycrystalline silicon semiconductor layer comprises a second channel region overlapping the second gate electrode, a second drain region located on one side of the second channel region, and a second source region located on an opposite side of the channel region.

In an example embodiment, the display device further comprises a second source electrode and a second drain electrode disposed on the same layer as the first source electrode, wherein the second source electrode is connected to the second source region, and the second drain electrode is connected to the second drain region.

In an example embodiment, the upper interlayer dielectric layer comprises a first upper interlayer dielectric layer and a second upper interlayer dielectric layer disposed on the first upper interlayer dielectric layer.

In an example embodiment, the first upper interlayer dielectric layer comprises silicon oxide, and wherein the second upper interlayer dielectric layer comprises silicon nitride.

In an example embodiment, a hydrogen concentration of the first upper interlayer dielectric layer is smaller than a hydrogen concentration of the second upper interlayer dielectric layer.

According to an embodiment of the present disclosure, a display device comprises a base substrate, a lower interlayer dielectric layer disposed on the base substrate, an oxide semiconductor layer disposed on the lower interlayer dielectric layer and comprising a first channel region, a first drain region located on one side of the first channel region, and a first source region located on an opposite side of the first channel region, a first gate insulating layer disposed on the oxide semiconductor layer, a first upper gate electrode disposed on the first gate insulating layer, an upper interlayer dielectric layer disposed on the first upper gate electrode, and a first source electrode and a first drain electrode disposed on the upper interlayer insulating layer, wherein the lower interlayer dielectric layer comprises a first lower interlayer dielectric layer disposed on the base substrate, and a second lower interlayer dielectric layer disposed on the first lower interlayer dielectric layer, wherein the first lower interlayer dielectric layer comprises silicon nitride and the second lower interlayer dielectric layer comprises silicon oxide, and wherein a layer density of the first lower interlayer dielectric layer ranges from 2.4 g/cm$^3$ to 2.57 g/cm$^3$.

In an example embodiment, a hydrogen concentration of the first lower interlayer dielectric layer is equal to or less than 1.26E+22 atoms/cm$^3$.

In an example embodiment, a compressive stress of the first lower interlayer dielectric layer ranges from −300 MPa to 0 MPa.

In an example embodiment, a thickness of the first lower interlayer dielectric layer ranges from 300 Å to 2,000 Å.

BRIEF DESCRIPTION OF THE DRAWINGS

The above and other aspects and features of the present disclosure will become more apparent by describing in detail example embodiments thereof with reference to the attached drawings, in which:

FIG. 11 is a chart showing the degree of warpage of Substrates #3 and #4.

FIG. 12 is a table showing the I-V curves for Transistors #1 and #2.

FIG. 13 is a table showing changes in the NBTS characteristics for Transistors #1 and #2.

FIG. 15 is a table showing changes in the PBTS characteristics for Transistors #1 and #2 at 70° C.

DETAILED DESCRIPTION OF THE EMBODIMENTS

The present disclosure will now be described more fully hereinafter with reference to the accompanying drawings, in which preferred embodiments of the disclosure are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the present disclosure. Similarly, the second element could also be termed the first element.

Each of the features of the various embodiments of the present disclosure may be combined or combined with each other, in part or in whole, and technically various interlocking and driving are possible. Each embodiment may be implemented independently of each other or may be implemented together in an association.

Hereinafter, example embodiments of the present disclosure will be described with reference to the accompanying drawings.

Figure 1:
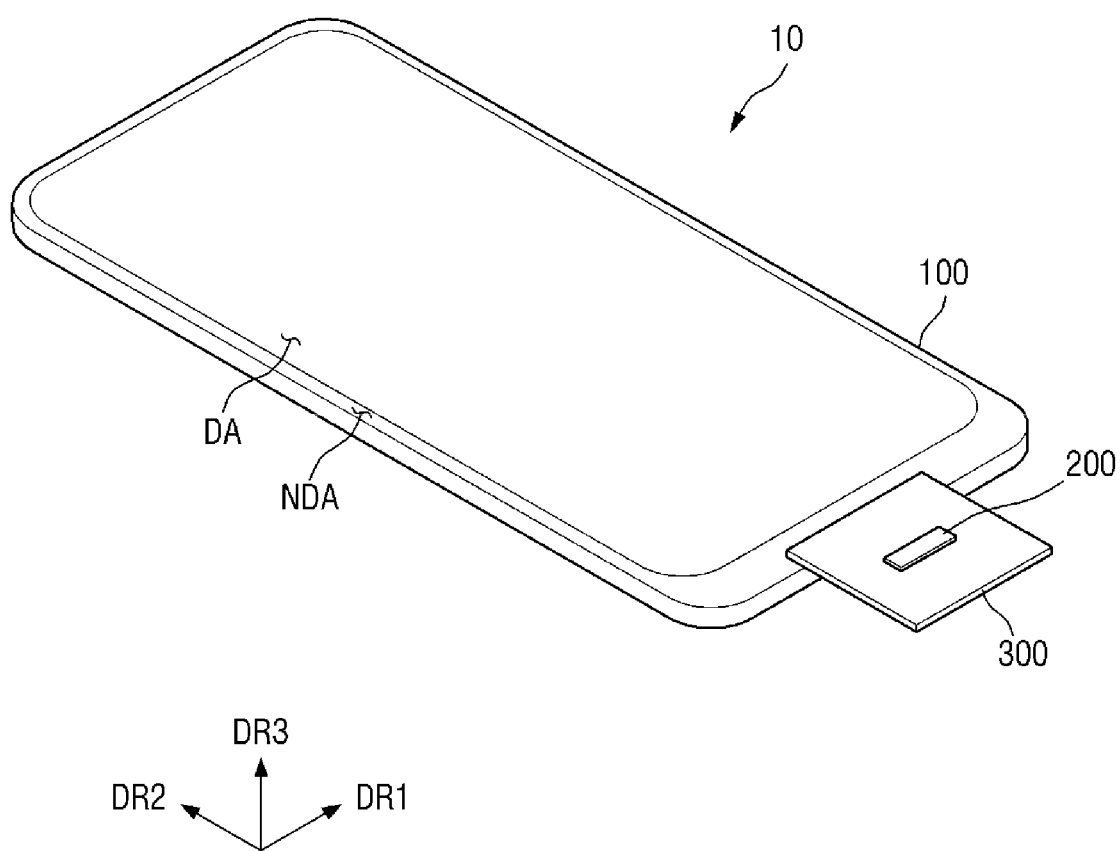
FIG. 1 is a perspective view of a display device according to an example embodiment of the present disclosure.
Figure 2:
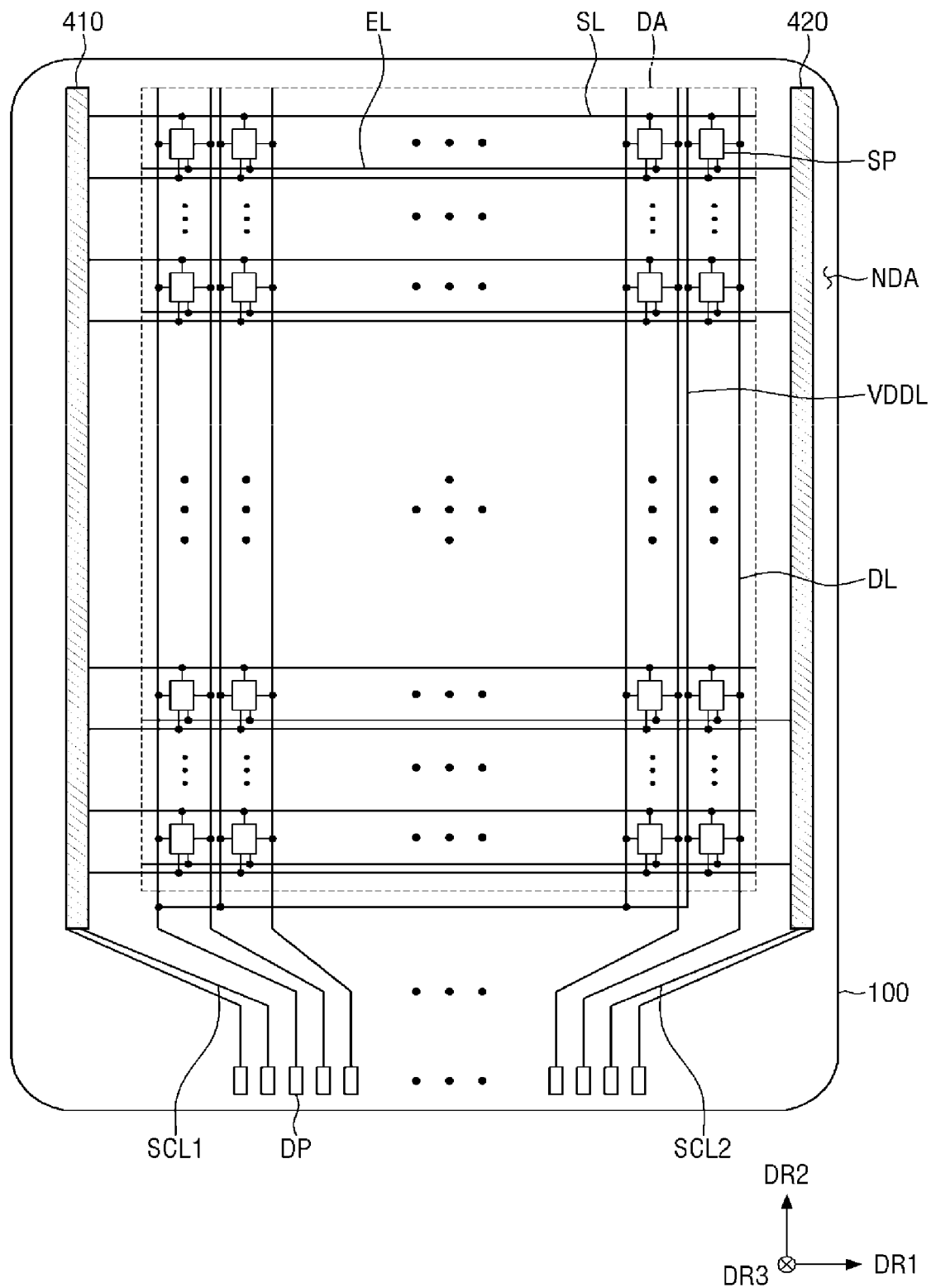
FIG. 2 is a plan view showing an example of a display panel according to an example embodiment of the present disclosure.

FIG. 1 is a perspective view of a display device according to an example embodiment of the present disclosure. FIG. 2 is a plan view showing an example of a display panel according to an example embodiment of the present disclosure.

As used herein, the terms "above," "top" and "upper surface" refer to the upper side of the display panel 100, i.e., the side indicated by the arrow in a third direction DR3, whereas the terms "below," "bottom" and "lower surface" refer to the lower side of the display panel 100, i.e., the opposite side in the third direction DR3.

A display device 10 is for displaying moving images or still images. The display device 1 may be used as the display screen of portable electronic devices such as a mobile phone, a smart phone, a tablet PC, a smart watch, a watch phone, a mobile communications terminal, an electronic notebook, an electronic book, a portable multimedia player (PMP), a navigation device and a ultra mobile PC (UMPC), as well as the display screen of various products such as a television, a notebook, a monitor, a billboard, and the Internet of Things. The display device 10 may be one of an organic light-emitting display device, a liquid-crystal display device, a plasma display device, a field emission display device, an electrophoretic display device, an electrowetting display device, a quantum dot light-emitting display device, a micro LED display device and the like. In the following description, an organic light-emitting display device is described as an example of the display device 10. It is, however, to be understood that the present disclosure is not limited thereto.

Referring to FIGS. 1 and 2, the display device 10 according to an example embodiment includes a display panel 100, a display driver 200, and a circuit board 300.

The display panel 100 may be formed in a rectangular plane having shorter sides in the first direction DR1 and longer sides in the second direction DR2 intersecting the first direction DR1. Each of the corners where the short side in the first direction DR1 meets the longer side in the second direction DR2 may be rounded with a predetermined curvature or may be a right angle. The shape of the display panel 100 when viewed from the top is not limited to a quadrangular shape, but may be formed in a different polygonal shape, a circular shape, or an elliptical shape. The display panel 100 may be, but is not limited to being, formed to be flat. The display panel 10 may include curved portions formed at left and right ends thereof and having a constant or varying curvature. In addition, the display panel 100 may be formed to be flexible so that it can be curved, bent, folded or rolled.

The display panel 100 may include a display area DA where sub-pixels SP are formed to display images, and a non-display area NDA which is the peripheral area of the display area DA. When the display panel 100 includes a curved portion, the display area DA may be disposed on the curved portion. In such case, images of the display panel 100 can also be seen on the curved portion.

In the display area DA, scan lines SL, emission lines EL, data lines DL and first supply voltage lines VDDL connected to the sub-pixels SP may be disposed, in addition to the sub-pixels SP. The scan lines SL and the emission lines EL may be arranged in the first direction DR1, while the data lines DL may be arranged in the second direction DR2 intersecting the first direction DR1. The first supply voltage lines VDDL may be arranged in parallel in the second direction DR2 in the display area DA. The first supply voltage lines VDDL formed in parallel in the second direction DR2 in the display area DA may be connected to one another in the non-display area NDA.

Each of the sub-pixels SP may be connected to at least one of the scan lines SL, at least one of the data lines DL, at least one of the emission lines EL, and at least one of the first supply voltage lines VDDL. In the example shown in FIG. 2, each of the sub-pixels SP is connected to two scan lines SL, one data line DL, one emission line EL, and the first supply voltage line VDDL for convenience of illustration. It is, however, to be understood that the present disclosure is not limited thereto. For example, each of the sub-pixels SP may be connected to three scan lines SL rather than two scan lines SL.

Each of the sub-pixels SP may include a driving transistor, at least one switching transistor, a light-emitting element, and a capacitor. When the data voltage is applied to the gate electrode, the driving transistor may supply a driving current to the light-emitting element, so that light can be emitted. The driving transistor and the at least one switching transistor may be thin-film transistors (TFTs). The light-emitting element may emit light in proportion to the driving current from the driving transistor. The light-emitting element may be an organic light-emitting diode including an anode electrode, an organic light emitting layer, and a cathode electrode. The capacitor can keep the data voltage applied to the gate electrode of the driving transistor constant.

The non-display area NDA may be defined as the area from the outer side of the display area DA to the edge of the display panel 100. In the non-display area NDA, a scan driver 410 for applying scan signals to scan lines SL, and pads DP connected to the data lines DL may be disposed. Since the circuit board 300 is attached to the pads DP, the pads DP may be disposed on one edge of the display panel 100, e.g., the lower edge of the display panel 100.

The scan driver 410 may be connected to the display driver 200 through a plurality of first scan control lines SCL1. The scan driver 410 may receive scan control signals from the pads DP through the plurality of first scan control lines SCL1. The scan driver 410 may generate scan signals according to the scan control signals and may sequentially output the scan signals to the scan lines SL. The sub-pixels SP to which the data voltages are supplied are selected by the scan signals of the scan driver 410 and the data voltages are supplied to the selected sub-pixels SP.

An emission control driver 420 may be connected to a display driver 200 through a plurality of second scan control lines SCL2. The emission control driver 420 may receive emission control signals from the pads DP through the plurality of second scan control lines SCL2. The emission control driver 420 may generate emission control signals according to the emission control signals and may sequentially output the emission control signals to the emission lines EL.

Although the scan driver 410 is disposed on a left side of the display area DA, and the emission control driver 420 is disposed on a right side of the display area DA as shown in FIG. 2, the present disclosure is not limited thereto. For example, both of the scan driver 410 and the emission control driver 420 may be disposed on insides of the display area DA, or one of the scan driver 410 or the emission control driver 420 is disposed on an inside of the display area DA.

The display driver 200 receives digital video data and timing signals from external devices. The display driver 200 converts the digital video data into analog positive/negative data voltages and supplies them to the data lines DL. The display driver 200 generates and supplies emission control signals for controlling the operation timing of the scan driver 410 through the first scan control lines SCL1. The display driver 200 generates and supplies emission control signals for controlling the operation timing of the emission control driver 420 through the second scan control lines SCL2. The display driver 200 may supply a first supply voltage to the first supply voltage lines VDDL.

The display driver 200 may be implemented as an integrated circuit (IC) and attached to the circuit board 300 by the chip-on-film (COF) technique. Alternatively, the display driver 200 may be attached to the display panel 100 by chip-on-glass (COG) technique, chip-on-plastic (COP) technique, or ultrasonic bonding.

The circuit board 300 may be attached to the pads DP using an anisotropic conductive film. In this manner, the lead lines of the circuit board 300 may be electrically connected to the pads DP. The circuit board 300 may be a flexible printed circuit board, a printed circuit board, or a flexible film such as a chip on film.

Figure 3:
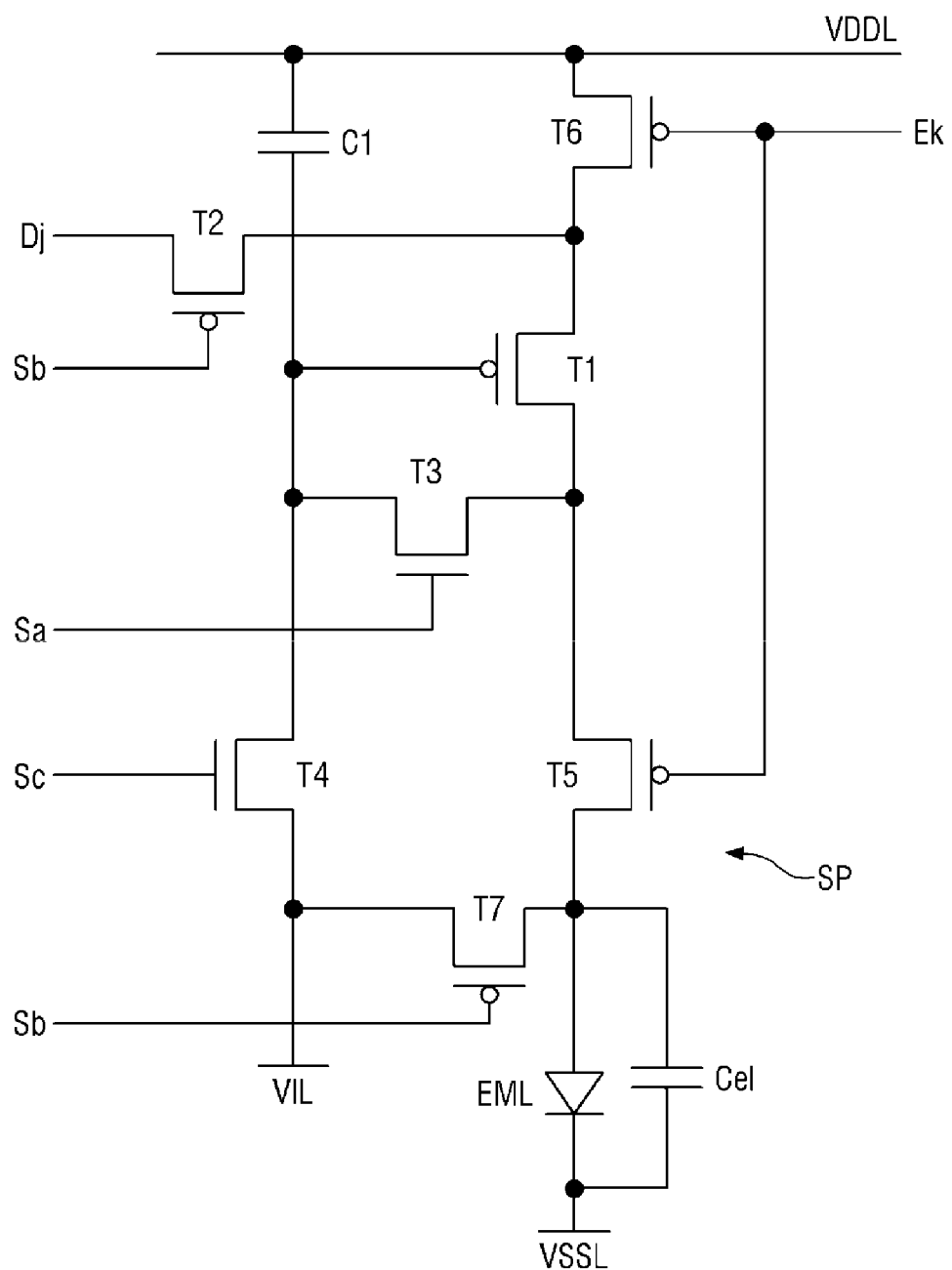
FIG. 3 is a circuit diagram showing an example of one of the sub-pixels of FIG. 2.

FIG. 3 is a circuit diagram showing an example of one of the sub-pixels of FIG. 2.

In FIG. 3, a circuit of a sub-pixel SP of the display device may include an organic light-emitting diode EML, a plurality of transistors T1, T2, T3, T4, T5, T6, and T7, and a capacitor C1. A data line Dj, a first scan line Sa, a second scan line Sb, a third scan line Sc, an emission line Ek, a first supply voltage line VDDL, a second supply voltage line VSSL, and an initializing voltage line VIL may be connected to the circuit of the sub-pixel.

The organic light-emitting diode EML may include an anode electrode and a cathode electrode. The capacitor C1 may include a first electrode and a second electrode.

The plurality of transistors may include first to seventh transistors T1, T2, T3, T4, T5, T6, and T7. Each of the transistors T1, T2, T3, T4, T5, T6, and T7 may include a gate electrode, a first electrode, and a second electrode. One of the first electrode and the second electrode of each of the transistors T1, T2, T3, T4, T5, T6, and T7 may be a source electrode while the other one may be a drain electrode.

Each of the transistors T1, T2, T3, T4, T5, T6, and T7 may be a thin-film transistor. Each of the transistors T1, T2, T3, T4, T5, T6, and T7 may be either a PMOS transistor or an NMOS transistor. In an example embodiment, the first transistor T1 as a driving transistor, the second transistor T2 as a data transfer transistor, the fifth transistor T5 as a first emission control transistor, the sixth transistor T6 as a second emission control transistor, and the seventh transistor T7 as a second initializing transistor are PMOS transistors. On the other hand, the third transistor T3 as a compensating transistor, and the fourth transistor T4 as a first initializing transistor are NMOS transistors. The PMOS transistors and the NMOS transistors have different characteristics. The third transistor T3 and the fourth transistor T4 are implemented with NMOS transistors having a relatively good turn-off characteristic so that leakage of the driving current during the emission period of the organic light-emitting diode OLED can be reduced.

Hereinafter, each of the elements will be described in detail.

The gate electrode of the first transistor T1 is connected to the first electrode of the capacitor C1. The first electrode of the first transistor T1 is connected to the terminal of the first supply voltage VDDL via the sixth transistor T6. The second electrode of the first transistor T1 is connected to the anode electrode of the organic light-emitting diode EML via the fifth transistor T5. The first transistor T1 receives the data signal DATA according to the switching operation of the second transistor T2 to supply the driving current to the organic light-emitting diode EML.

The gate electrode of the second transistor T2 is connected to the terminal of the second scan line Sb. The first electrode of the second transistor T2 is connected to the terminal of the data line Dj. The second electrode of the second transistor T2 is connected to the first electrode of the first transistor T1 and is connected to the terminal of the first supply voltage VDDL through the sixth transistor T6. The second transistor T2 performs switching operation in such a manner that it is turned on in response to a signal applied to the second scan line Sb to transfer a data signal applied through a data line Dj to the first electrode of the first transistor T1.

The gate electrode of the third transistor T3 is connected to the terminal of the first scan line Sa. The first electrode of the third transistor T3 is connected to the second electrode of the first transistor T1 and is connected to the anode electrode of the organic light-emitting diode EML via the fifth transistor T5. The second electrode of the third transistor T3 is connected to the first electrode of the capacitor C1, the first electrode of the fourth transistor T4 and the gate electrode of the first transistor T1. The third transistor T3 is turned on in response to the signal of the first scan line Sa to connect the gate electrode with the second electrode of the first transistor T1, to diode-connect the first transistor T1. Accordingly, a voltage difference equal to the threshold voltage of the first transistor T1 is generated between the first electrode and the gate electrode of the first transistor T1. Deviations in the threshold voltage of the first transistor T1 can be compensated by supplying the data signal that compensates for the threshold voltage to the gate electrode of the first transistor T1.

The gate electrode of the fourth transistor T4 is connected to the terminal of the third scan line Sc. The second electrode of the fourth transistor T4 is connected to the terminal of the initializing voltage line VIL. The first electrode of the fourth transistor T4 is connected to the first electrode of the capacitor C1, the second electrode of the third transistor T3 and the gate electrode of the first transistor T1. The fourth transistor T4 is turned on in response to the signal of the third scan line Sc to transfer the initializing voltage signal of the initializing voltage line VIL to the gate electrode of the first transistor T1, to initialize the voltage at the gate electrode of the first transistor T1.

The gate electrode of the fifth transistor T5 is connected to the terminal of the emission line Ek. The first electrode of the fifth transistor T5 is connected to the second electrode of the first transistor T1 and the first electrode of the third transistor T3. The second electrode of the sixth transistor T6 is connected to the anode electrode of the organic light-emitting diode EML.

The gate electrode of the sixth transistor T6 is connected to the terminal of the emission line Ek. The first electrode of the sixth transistor T6 is connected to the terminal of the first supply voltage VDDL. The second electrode of the sixth transistor T6 is connected to the first electrode of the first transistor T1 and the second electrode of the second transistor T2.

The fifth transistor T5 and the sixth transistor T6 are simultaneously turned on in response to the emission control signal of the emission line Ek so that the driving current flows through the organic light-emitting diode EML.

The gate electrode of the seventh transistor T7 is connected to the terminal of the second scan line Sb. The first electrode of the seventh transistor T7 is connected to the anode electrode of the organic light-emitting diode EML. The second electrode of the seventh transistor T7 is connected to the terminal of the initializing voltage line VIL. The seventh transistor T7 is turned on in response to the emission control signal of the emission line Ek to initialize the anode electrode of the organic light-emitting diode EML.

Although the signal of the second scan line Sb is applied to the gate electrode of the seventh transistor T7 in this example embodiment of the present disclosure, the pixel circuit may be configured such that the emission control signal of the emission line Ek may be applied to the gate electrode of the seventh transistor T7 in another example embodiment.

The second electrode of the capacitor C1 is connected to the terminal of the first supply voltage line VDDL. The first electrode of the capacitor C1 is connected to the gate electrode of the first transistor T1, the second electrode of the third transistor T3 and the first electrode of the fourth transistor T4. The cathode electrode of the organic light-emitting diode EML is connected to the terminal of the second supply voltage line VSSL. The organic light-emitting diode EML displays an image by receiving a driving current from the first transistor T1 to emit light.

Each of the first to seventh transistors T1, T2, T3, T4, T5, T6 and T7 may include a semiconductor layer. Some of the first to seventh transistors T1, T2, T3, T4, T5, T6 and T7 may include a semiconductor layer made of polycrystalline silicon, while some others of the first to seventh transistors T1, T2, T3, T4, T5, T6 and T7 may include a semiconductor layer made of oxide. For example, the semiconductor layers of the first to seventh transistors T1, T2, T3, T4, T5, T6 and T7 may be made of polycrystalline silicon. Alternatively, the semiconductor layers of the first transistor T1, the fifth transistor T5 to the seventh transistor T7 may be made of polycrystalline silicon while the semiconductor layers of the third transistor T3 and the fourth transistor T4 may be made of oxide. For example, the semiconductor layer of the driving transistor may include polycrystalline silicon, and the semiconductor layer of the switching transistor may include oxide.

The semiconductor layer of the switching transistor may include a first channel region overlapping the gate electrode of the switching transistor, a first drain region located on one side of the first channel region, and a first source region located on the other side of the first channel region. The semiconductor layer of the driving transistor may include a second channel region overlapping the gate electrode of the driving transistor, a second drain region located on one side of the second channel region, and a second source region located on the other side of the second channel region.

Compared to the first channel region, a number of carrier ions may be included in the first source region and the first drain region. According to the example embodiment of the present disclosure, the carrier ions may include oxygen atoms ($O^{2-}$) included in the oxide semiconductor layer 145, vacancy (Vo) formed when bonds of oxygen atoms are broken, and hydrogen ions ($H^-$) introduced from adjacent layers. The ratio and/or concentration of oxygen ions ($O^{2-}$) and the vacancy (Vo) may be determined in advance when the oxide semiconductor layer 145 is formed. However, it may not be easy to control hydrogen ions introduced from adjacent layers. The concentration of hydrogen ions introduced from adjacent layers may increase a threshold voltage of element such as a switching transistor, and may deteriorate device characteristics.

In addition, at least one insulating layer including silicon nitride and silicon oxide may be disposed under the switching transistor. When a plurality of constituent layers to be described later is formed on the base substrate, the base substrate may be warped by compressive stresses of the constituent layers. In particular, for an insulating layer containing silicon nitride, the degree of warpage of the base substrate becomes large, and thus an error may occur in the course of transporting the base substrate.

Hereinafter, a display device will be described which can prevent warpage of a base substrate without deteriorating the device characteristics of a switching transistor.

Figure 4:
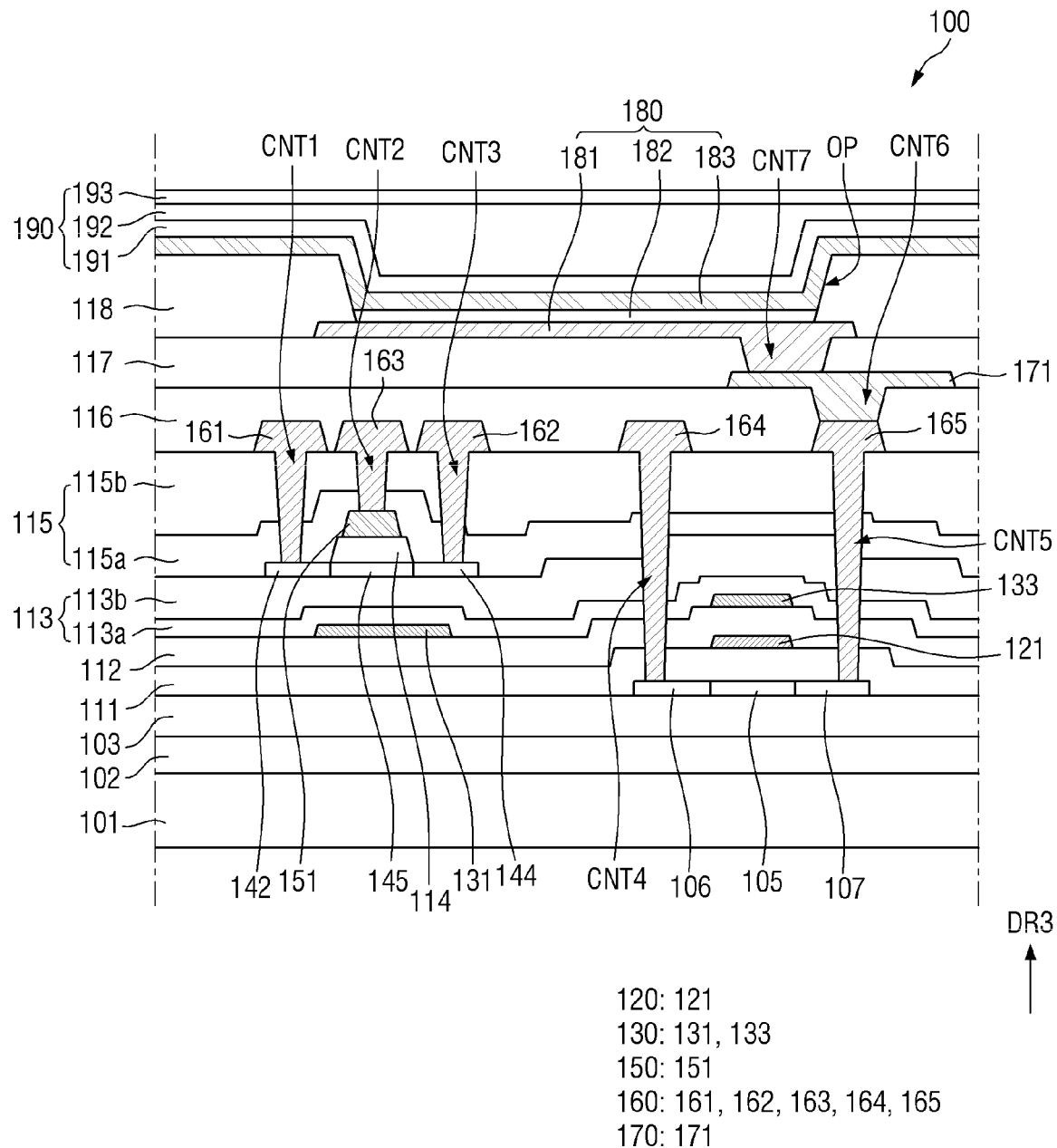
FIG. 4 is a cross-sectional view of a display panel according to an example embodiment of the present disclosure.
Figure 5:
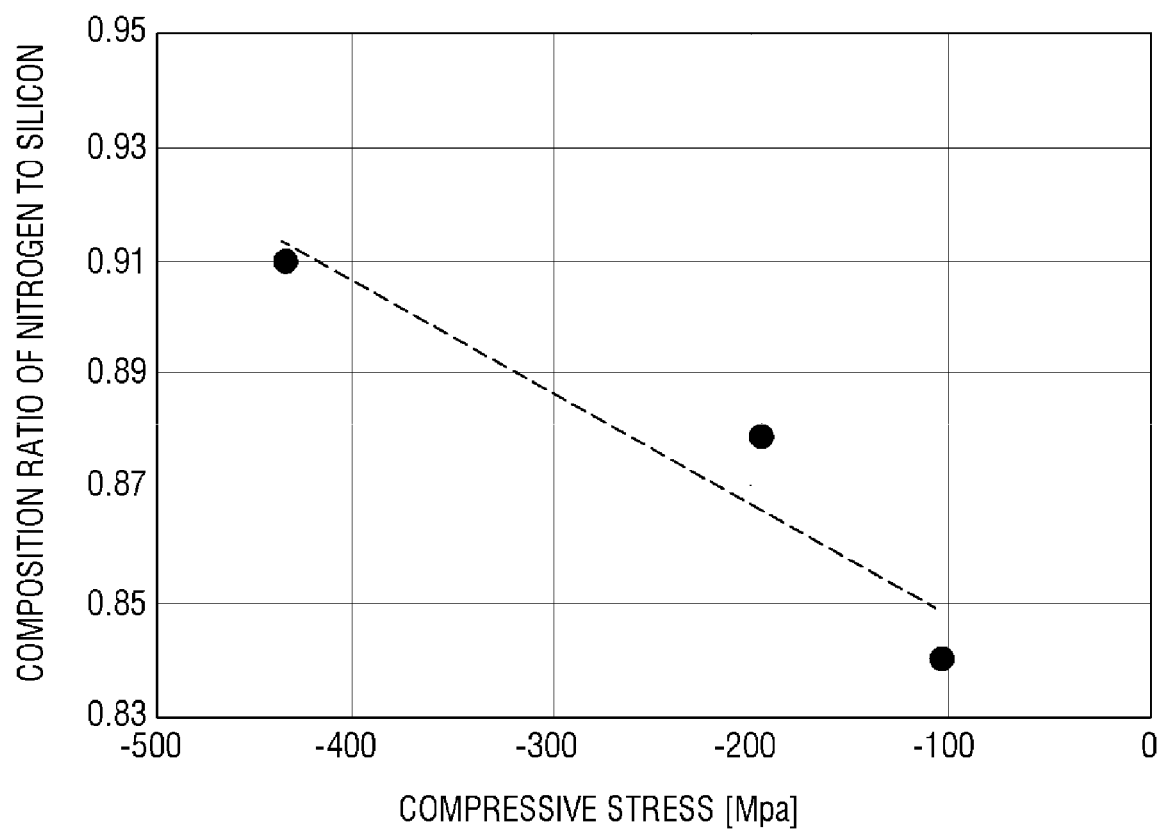
FIG. 5 is a graph showing compressive stress according to a composition ratio of nitrogen to silicon in a first lower interlayer dielectric layer according to an example embodiment of the present disclosure.
Figure 6:
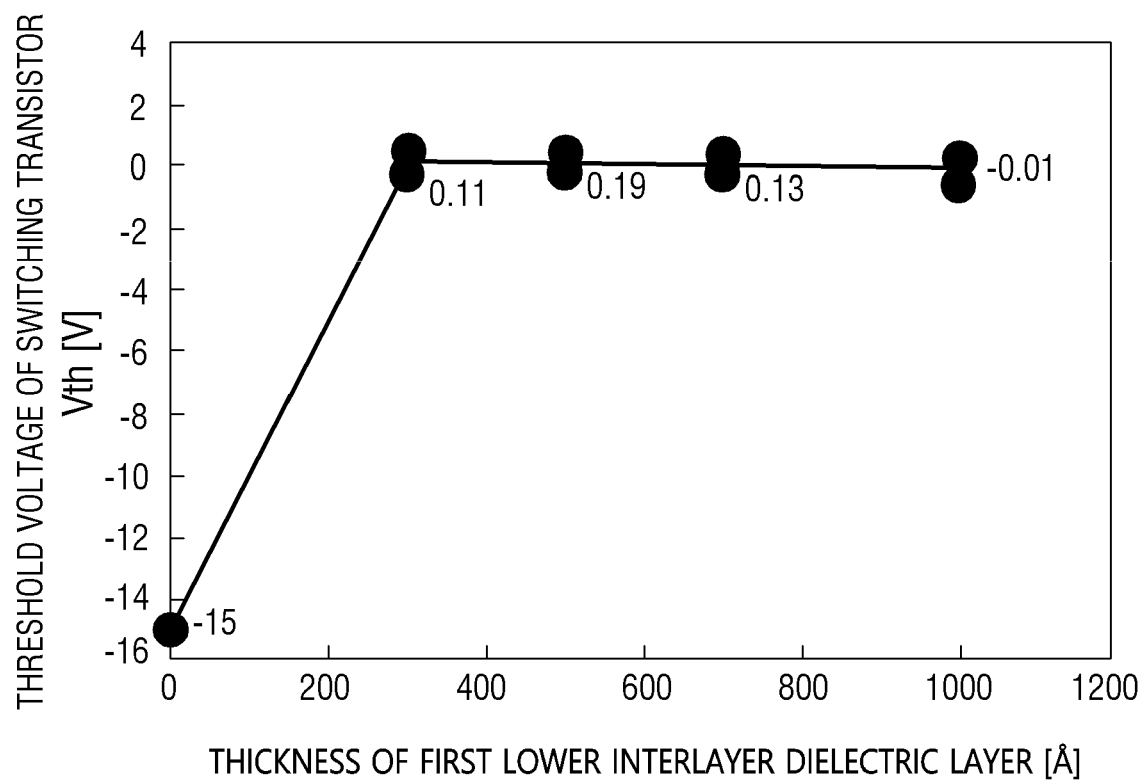
FIG. 6 is a graph showing a threshold voltage of a switching transistor versus a thickness of a first lower interlayer dielectric layer.
Figure 7:
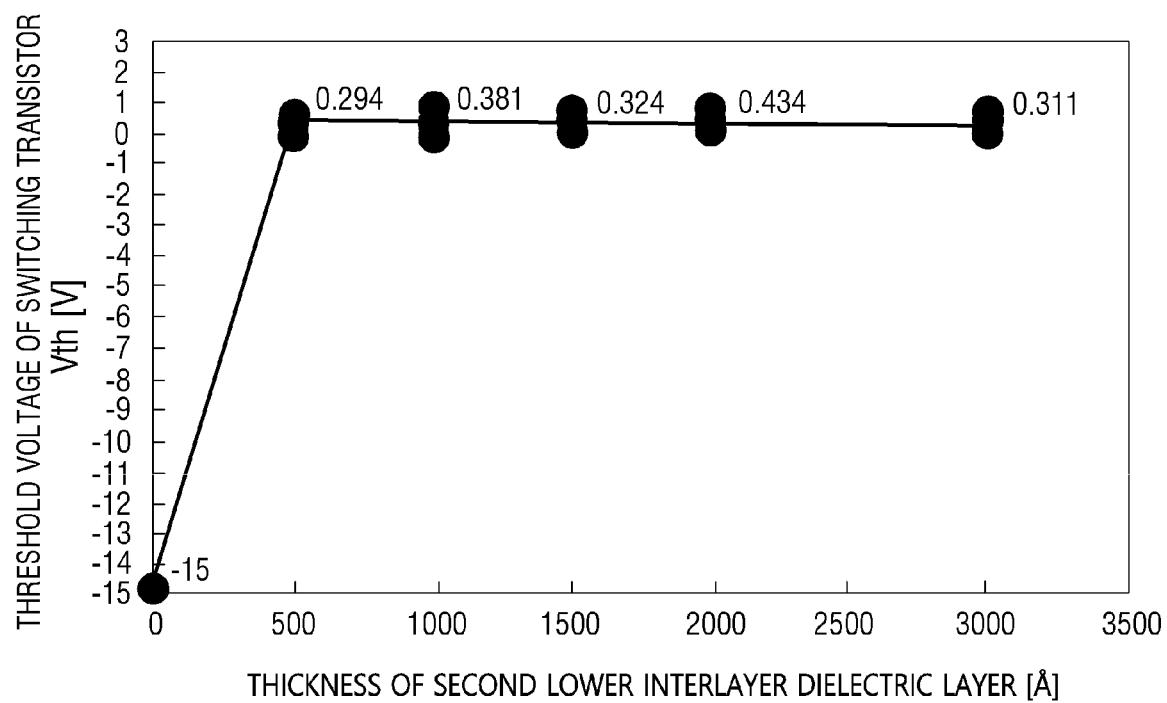
FIG. 7 is a graph showing a threshold voltage of a switching transistor versus a thickness of a second lower interlayer dielectric layer.

FIG. 4 is a cross-sectional view of a display panel according to an example embodiment of the present disclosure. FIG. 5 is a graph showing compressive stress according to a composition ratio of nitrogen to silicon in a first lower interlayer dielectric layer according to an example embodiment of the present disclosure. FIG. 6 is a graph showing a threshold voltage of a switching transistor versus a thickness of a first lower interlayer dielectric layer. FIG. 7 is a graph showing a threshold voltage of a switching transistor versus a thickness of a second lower interlayer dielectric layer.

Referring to FIG. 4, the display panel 100 according to an example embodiment may include a switching transistor ST, a driving transistor DT, and an organic light-emitting diode EML on a base substrate 101.

Specifically, the base substrate 101 supports the layers disposed thereon. A transparent substrate may be used when the organic light-emitting display device is of a bottom-emission or both-sided emission type. When the organic light-emitting display device is of a top-emission type, a semitransparent or opaque substrate and a transparent substrate may be employed. The base substrate 101 may include a rigid material such as glass and quartz, or may include a flexible material such as plastic.

A barrier layer 102 may be disposed on the base substrate 101. The barrier layer 102 may prevent impurity ions from diffusing, may prevent permeation of moisture or outside air, and may provide a flat surface. The barrier layer 102 may include silicon nitride, silicon oxide, silicon oxynitride, or the like. The barrier layer 102 may be eliminated depending on the type of the base substrate 101, process conditions, etc.

A buffer layer 103 may be disposed on the barrier layer 102. The buffer layer 103 may be made of a material including at least one of silicon nitride, silicon oxide and silicon oxynitride. The buffer layer 103 may be eliminated depending on the type of the base substrate 101, process conditions, etc.

A polycrystalline silicon semiconductor layer 105 may be disposed on the buffer layer 103. The polycrystalline silicon semiconductor layer 105 may be made of amorphous silicon or poly silicon. The crystalline silicon may be produced by crystallizing amorphous silicon. Examples of the crystallizing techniques may include, but is not limited to, rapid thermal annealing (RTA), solid phase crystallization (SPC), excimer laser annealing (ELA), metal induced crystallization (MIC), metal induced lateral crystallization (MILC), sequential lateral solidification (SLS), etc.

The polycrystalline silicon semiconductor layer 105 may include a second channel region overlapping the second gate electrode 121 in the thickness direction, a second drain region located on one side of the second channel region, and a second source region located on the other side of the second channel region.

A lower gate insulating layer 111 may be disposed on the polycrystalline silicon semiconductor layer 105. The lower gate insulating layer 111 may be a gate insulating layer having a gate insulating function. The lower gate insulating layer 111 may include a silicon compound, a metal oxide, etc. For example, the lower gate insulating layer 111 may include silicon oxide, silicon nitride, silicon oxynitride, aluminum oxide, tantalum oxide, hafnium oxide, zirconium oxide, titanium oxide, etc. They may be used alone or in combinations. The lower gate insulating layer 111 may be made up of a single layer or multiple layers of different materials stacked on one another.

A first conductive layer 120 may be disposed on the lower gate insulating layer 111. The first conductive layer 120 may include the second gate electrode 121. The first conductive layer 120 may include at least one metal selected from the group consisting of: molybdenum (Mo), aluminum (Al), platinum (Pt), palladium (Pd), silver (Ag), magnesium (Mg), gold (Au), nickel (Ni), neodymium (Nd), iridium (Jr), chromium (Cr), calcium (Ca), titanium (Ti), tantalum (Ta), tungsten (W), and copper (Cu). The first conductive layer 120 may be made up of a single layer or multiple layers.

An upper gate insulating layer 112 may be disposed on the first conductive layer 120 including the second gate electrode 121. The upper gate insulating layer 112 may be a gate insulating layer having a gate insulating function. The upper gate insulating layer 112 may include a silicon compound, a metal oxide, etc. For example, the upper gate insulating layer 112 may include silicon oxide, silicon nitride, silicon oxynitride, aluminum oxide, tantalum oxide, hafnium oxide, zirconium oxide, titanium oxide, etc. They may be used alone or in combinations. The upper gate insulating layer 112 may be made up of a single layer or multiple layers of different materials stacked on one another.

A second conductive layer 130 may be disposed on the upper gate insulating layer 112. The second conductive layer 130 may include at least one metal selected from the group consisting of: molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu). The second conductive layer 130 may be made up of a single layer or multiple layers.

The second conductive layer 130 may include a first lower gate electrode 131 and a capacitor electrode 133. The first lower gate electrode 131 may be disposed to overlap with the first channel region of the oxide semiconductor layer 145 in the thickness direction. The capacitor electrode 133 may be disposed to overlap with the second channel region of the polycrystalline silicon semiconductor layer 105 in the thickness direction.

A lower interlayer dielectric layer 113 may be disposed on the second conductive layer 130. The lower interlayer dielectric layer 113 may include a first lower interlayer dielectric layer 113a disposed on the second conductive layer 130 and a second lower interlayer dielectric layer 113b spaced apart from the second conductive layer 130 with respect to the first lower interlayer dielectric layer 113a therebetween. The first lower interlayer dielectric layer 113a may be disposed between the second lower interlayer dielectric layer 113b and the second conductive layer 130. The first lower interlayer dielectric layer 113a and the second lower interlayer dielectric layer 113b may be in contact with each other.

The first lower interlayer dielectric layer 113a and the second lower interlayer dielectric layer 113b may include different materials. The first lower interlayer dielectric layer 113a may include silicon nitride, and the second lower interlayer dielectric layer 113b may include silicon oxide. Each of the first lower interlayer dielectric layer 113a and the second lower interlayer dielectric layer 113b may be formed by chemical vapor deposition.

Typically, silicon nitride may have a better ability to prevent permeation of impurities than silicon oxide. An insulating layer containing silicon nitride may have a higher hydrogen ion concentration than an insulating layer containing silicon oxide. This is because the material gas used to form the insulating layer containing silicon oxide by the chemical vapor deposition is different from the material gas used to form the insulating layer containing silicon nitride by the chemical vapor deposition.

More specifically, ammonium gas is used as one of the material gases used to form the insulating layer containing silicon nitride by the chemical vapor deposition. Such ammonium gas may increase the hydrogen ion concentration of the insulating layer containing silicon nitride. On the other hand, ammonium gas may not be used in forming the insulating layer containing silicon oxide.

The first lower gate electrode 131 and the capacitor electrode 133 may be formed by depositing the second conductive layer 130 entirely on the upper gate insulating layer 112 and then etching it. The etching may be dry etching. During dry etching, an etching gas such as hydrogen fluoride (HF) may be used. After the first lower gate electrode 131 is formed by dry etching, fluorine ions (F$^-$) of hydrogen fluoride (HF) may remain on the surface of the first lower gate electrode 131. Impurities such as fluorine ions (F$^-$) remaining on the surface of the first lower gate electrode 131 may penetrate into the oxide semiconductor layer 145 thereon during a subsequent annealing process to lower the threshold voltage of the oxide semiconductor layer 145, for example, which may result in defects.

The lower interlayer dielectric layer 113 according to the example embodiment of the present disclosure includes a stack structure of the first lower interlayer dielectric layer 113a containing silicon nitride having good ability to prevent permeation of impurities, and a second lower interlayer dielectric layer 113b containing silicon oxide and having a lower hydrogen concentration than the first lower interlayer dielectric layer and disposed directly on it. In this manner, it is possible to prevent impurities that have moved from the first lower gate electrode 131 from penetrating into the oxide semiconductor layer 145 and hydrogen ions from penetrating the oxide semiconductor layer 145.

When the first lower interlayer dielectric layer 113a is stacked on the base substrate 101, it may have a certain compressive stress. The compressive stress of the first lower interlayer dielectric layer 113a may vary depending on the composition ratio of nitrogen to silicon and the layer density.

According to an example embodiment of the present disclosure, the first lower interlayer dielectric layer 113a may have a composition ratio of nitrogen to silicon of 0.8 to 0.89.

Referring to the graph shown in FIG. 5, the horizontal axis represents the compressive stress of the first lower interlayer dielectric layer 113a, and the vertical axis represents the composition ratio of nitrogen to silicon in the first lower interlayer dielectric layer 113a. In FIG. 5, the first lower interlayer dielectric layer 113a is formed on the base substrate 101 with the thickness of 1,100 Å, and the compressive stress for difference composition ratios of nitrogen to silicon was measured.

As shown in FIG. 5, the compressive stress of the first lower interlayer dielectric layer 113a gradually decreases from −440 MPa to −100 MPa as the composition ratio of nitrogen to silicon decreases from 0.91 to 0.83.

As described above, according to an example embodiment of the present disclosure, by forming the composition ratio of nitrogen to silicon in the range of 0.8 to 0.89 in the first lower interlayer dielectric layer 113a, it is possible to form the compressive stress of the first lower interlayer dielectric layer 113a in the range of −300 MPa to 0 MPa. In this manner, by forming the first lower interlayer dielectric layer 113a on the base substrate 101, it is possible to prevent warpage of the base substrate 101 due to a large compressive stress of the first lower interlayer dielectric layer 113a.

In addition, according to an example embodiment of the present disclosure, a layer density of the first lower interlayer dielectric layer 113a may range from 2.4 to 2.57 $g/cm^3$. As the layer density of the first lower interlayer dielectric layer 113a decreases, the compressive stress of the first lower interlayer dielectric layer 113a may decrease. According to the example embodiment of the present disclosure, by forming the layer density of the first lower interlayer dielectric layer 113a in the range of 2.4 to 2.57 $g/cm^3$, the compressive stress of the first lower interlayer dielectric layer 113a can be lowered, so that it is possible to prevent warpage of the base substrate.

As described above, by lowering the composition ratio of nitrogen to silicon and the layer density of the first lower interlayer dielectric layer 113a, it is possible to form the compressive stress of the first lower interlayer dielectric layer in the range of −300 to 0 MPa. In this manner, it is possible to reduce the compressive stress of the first lower interlayer dielectric layer 113a when the first lower interlayer dielectric layer 113a is formed on the base substrate 101, to prevent warpage of the base substrate 101.

In addition, according to an example embodiment of the present disclosure, the hydrogen concentration of the first lower interlayer dielectric layer 113a may be equal to or less than 1.26E+22 $atoms/cm^3$. By making the hydrogen concentration of the first lower interlayer insulating layer 113a lower than 1.26E+22 $atoms/cm^3$, it is possible to prevent the amount of hydrogen ions transferred to the oxide semiconductor layer 145 from increasing, thereby preventing the deterioration of the electrical characteristics of the oxide semiconductor layer 145.

The first lower interlayer dielectric layer 113a and the second lower interlayer dielectric layer 113b may have a predetermined thickness for electrical properties of the oxide semiconductor layer 145.

In the graph shown in FIG. 6, the horizontal axis represents the thickness of the first lower interlayer dielectric layer 113a, and the vertical axis represents the threshold voltage of the switching transistor. The results in the graph shown in FIG. 6 were obtained by forming the first lower interlayer dielectric layer 113a in a predetermined range on the base substrate 101, forming a second lower interlayer dielectric layer 113b with the thickness of 3,000 Å thereon, and then forming a switching transistor including an oxide semiconductor layer. Then, the threshold voltage of the switching transistor was measured by adjusting the thickness of the first lower interlayer dielectric layer 113a within the range of 0 to 1,200 Å.

As shown in FIG. 6, the threshold voltage of the first lower interlayer dielectric layer 113a increases as the thickness increases from 0 Å to 300 Å, and the threshold voltage maintains substantially uniform beyond the thickness of 300 Å. In particular, when the thickness of the first lower interlayer dielectric layer 113a is above 300 Å or more, the threshold voltage of the switching transistor remains consistent.

As such, since the first lower interlayer dielectric layer 113a has a thickness in the range of 300 Å to 2,000 Å, it is possible to maintain the threshold voltage characteristic of the switching transistor.

In addition, in the graph shown in FIG. 7, the horizontal axis represents the thickness of the second lower interlayer dielectric layer 113b, and the vertical axis represents the threshold voltage of the switching transistor. The results in the graph shown in FIG. 7 were obtained by forming the first lower interlayer dielectric layer 113a on the base substrate 101 to the thickness of 1,100 Å, forming a second lower interlayer dielectric layer 113b with a thickness of a predetermined range thereon, and then forming a switching transistor including an oxide semiconductor layer. Then, the threshold voltage of the switching transistor was measured by adjusting the thickness of the second lower interlayer dielectric layer 113b within the range of 0 to 3,500 Å.

It can be seen from FIG. 7 that the threshold voltage of the second lower interlayer dielectric layer 113b increases as the thickness increases from 0 Å to 500 Å, and the threshold voltage maintains substantially uniform beyond the thickness of 500 Å. In particular, when the thickness of the second lower interlayer dielectric layer 113b is above 500 Å or more, the threshold voltage of the switching transistor remains consistent within an appropriate range.

As such, since the second lower interlayer dielectric layer 113b has a thickness in the range of 500 Å to 4,000 Å, it is possible to maintain the threshold voltage characteristic of the switching transistor.

According to an example embodiment of the present disclosure, the thickness of the first lower interlayer dielectric layer 113a may be smaller than the thickness of the second lower interlayer dielectric layer 113b. It is, however, to be understood that the present disclosure is not limited thereto. The thickness of the first lower interlayer dielectric layer 113a may be equal to or greater than the thickness of the second lower interlayer dielectric layer 113b.

The oxide semiconductor layer 145 may be disposed on the lower interlayer dielectric layer 113. The oxide semiconductor layer 145 may include oxide. The oxide may include one or more oxides selected from zinc (Zn), indium (In), gallium (Ga), tin (Sn) cadmium (Cd), germanium (Ge) hafnium (Hf), or a combination thereof. The oxide may include at least one of indium-gallium-zinc oxide (IGZO), zinc-tin oxide (ZTO), indium-tin oxide (IZO), etc.

A first gate insulating layer 114 may be disposed on the oxide semiconductor layer 145. The first gate insulating layer 114 may be a gate insulating layer having a gate insulating function. The first gate insulating layer 114 may include a silicon compound, a metal oxide, etc. For example, the first gate insulating layer 114 may include silicon oxide, silicon nitride, silicon oxynitride, aluminum oxide, tantalum oxide, hafnium oxide, zirconium oxide, titanium oxide, etc. They may be used alone or in combinations. The first gate insulating layer 114 may be made up of a single layer or multiple layers of different materials stacked on one another.

A portion of the upper surface of the first source region and the first drain region of the oxide semiconductor layer 145 may be exposed by the first gate insulating layer 114. The first gate insulating layer 114 may be disposed to overlap the first channel region of the oxide semiconductor layer 145 in the thickness direction and may be disposed not to overlap the first source region and the first drain region.

A second conductive layer 150 may be disposed on the first gate insulating layer 114. The second conductive layer 150 may include at least one metal selected from the group consisting of: molybdenum (Mo), aluminum (Al), platinum (Pt), palladium (Pd), silver (Ag), magnesium (Mg), gold (Au), nickel (Ni), neodymium (Nd), iridium (Jr), chromium (Cr), calcium (Ca), titanium (Ti), tantalum (Ta), tungsten (W), and copper (Cu). The second conductive layer 150 may be made up of a single layer or multiple layers.

The second conductive layer 150 may include a first upper gate electrode 151. The entirety of the first upper gate electrode 151 may be disposed on and overlap the first gate insulating layer 114 in the thickness direction (the third direction, DR3).

According to an example embodiment of the present disclosure, the gate electrode of the switching transistor may be a double gate electrode including a first upper gate electrode 151 and a first lower gate electrode 131. The first upper gate electrode 151 may be electrically connected to the first lower gate electrode 131. The capacitor electrode 133 and the second gate electrode 121 may form a capacitor by interposing the upper gate insulating layer 112 therebetween.

An upper interlayer dielectric layer 115 may be disposed on the second conductive layer 150. The upper interlayer dielectric layer 115 may cover the first upper gate electrode 151, the side surfaces of the first gate insulating layer 114, and the exposed upper surface of the oxide semiconductor layer in the first source region and the first drain region.

The upper interlayer dielectric layer 115 may include a first upper interlayer dielectric layer 115a disposed on the first upper gate electrode 151, and a second upper interlayer dielectric layer 115b disposed on the first upper interlayer dielectric layer 115a.

The first upper interlayer dielectric layer 115a may be in direct contact with the first upper gate electrode 151 and the upper and side surfaces of the first gate insulating layer 114, and the exposed upper surfaces of the first source region and the first drain region. The second upper interlayer dielectric layer 115b may be disposed directly on the first upper interlayer dielectric layer 115a. The first upper interlayer dielectric layer 115a may include silicon oxide, and the second upper interlayer dielectric layer 115b may include silicon nitride.

The hydrogen concentration of the first upper interlayer dielectric layer 115a may be less than the hydrogen concentration of the second upper interlayer dielectric layer 115b.

In the upper interlayer dielectric layer 115 according to an example embodiment of the present disclosure, the first upper interlayer dielectric layer 115a having a hydrogen concentration lower than the hydrogen concentration of the second upper interlayer dielectric layer 115b may be disposed directly above the first upper gate electrode 131 and the oxide semiconductor layer 145, and the second upper interlayer dielectric layer 115b containing silicon nitride having a better ability to prevent permeation of impurities than the first upper interlayer dielectric layer 115a containing silicon oxide may be disposed on the first upper interlayer dielectric layer 115a.

The second upper interlayer insulating layer 115b containing silicon nitride may have a number of hydrogen concentrations as described above. Such hydrogen ions inside the second upper interlayer dielectric layer 115b may move to the oxide semiconductor layer 145. In particular, before a fourth conductive layer 160 (to be described later) is formed, the first to fifth contact holes CNT1, CNT2, CNT3, CNT4, and CNT5 are formed, and then heat is applied during an annealing process. Such hydrogen ions inside the second upper interlayer dielectric layer 115b may move to the oxide semiconductor layer 145 by the heat.

In the upper interlayer dielectric layer 115 according to an example embodiment of the present disclosure, the hydrogen concentration of the first upper interlayer dielectric layer 115a is lower than the hydrogen concentration of the second upper interlayer dielectric layer 115b thereon, so that it is possible to suppress the hydrogen ions inside the second upper interlayer dielectric layer 115b from moving to the oxide semiconductor layer 145.

The fourth conductive layer 160 may be disposed on the upper interlayer dielectric layer 115. The fourth conductive layer 160 may include at least one metal selected from the group consisting of: molybdenum (Mo), aluminum (Al), platinum (Pt), palladium (Pd), silver (Ag), magnesium (Mg), gold (Au), nickel (Ni), neodymium (Nd), iridium (Jr), chromium (Cr), calcium (Ca), titanium (Ti), tantalum (Ta), tungsten (W), and copper (Cu). The fourth conductive layer 160 may be made up of a single layer or multiple layers.

The fourth conductive layer 160 may include a first source electrode 161, a first drain electrode 162, a second source electrode 164, and a second drain electrode 165. The fourth conductive layer 160 may further include a first connection electrode 163.

The first source electrode 161 and the first drain electrode 162 may be connected to the first source region and the first drain region through the first and third contact holes CNT1 and CNT3 penetrating the upper interlayer insulating layer 115, respectively. The second source electrode 164 and the second drain electrode 165 may be connected to the second source region and the second drain region of the polycrystalline silicon semiconductor layer 105 through the fourth and fifth contact holes CNT4 and CNT5 penetrating the upper interlayer dielectric layer 115, the lower interlayer dielectric layer 113 and the gate insulating layers 111 and 112, respectively.

The first connection electrode 163 may be connected to the first upper gate electrode 151 through the second contact hole CNT2 penetrating through the upper interlayer dielectric layer 115. The first connection electrode 163 is electrically connected to the first upper gate electrode 151, so that the resistance of the first upper gate electrode 151 can be reduced.

A first via layer 116 may be disposed over the fourth conductive layer 160. The first via layer 116 may include an inorganic insulating material or an organic insulating material such as polyacrylate resin, epoxy resin, phenolic resin, polyamide resin, polyimide resin, unsaturated polyesters resin, poly phenylen ether resin, poly phenylene sulfide resin, and benzocyclobutene (BCB). The first via layer 116 may be made up of a single layer or multiple layers of different materials stacked on one another.

A fifth conductive layer 170 may be disposed on the first via layer 116. The fifth conductive layer 170 may include a second connection electrode 171. The fifth conductive layer 170 may include at least one metal selected from the group consisting of molybdenum (Mo), aluminum (Al), platinum (Pt), palladium (Pd), silver (Ag), magnesium (Mg), gold (Au), nickel (Ni), neodymium (Nd), iridium (Jr), chromium (Cr), calcium (Ca), titanium (Ti), tantalum (Ta), tungsten (W), and copper (Cu). The fifth conductive layer 170 may be made up of a single layer or multiple layers.

The second connection electrode 171 may be connected to the second drain electrode 165 through a sixth contact hole CNT6 that partially penetrates the first via layer 116 to expose the upper surface of the second drain electrode 165.

An anode electrode 181 may be disposed on the second via layer 117 and the second connection electrode 171. The anode electrode 181 may be connected to the second connection electrode 171 through a seventh contact hole CNT7 penetrating the second via layer 117. The anode electrode 181 may be separately disposed for each sub-pixel SP (see FIG. 2).

A bank layer 118 may be disposed on the anode electrode 181. The bank layer 118 may include an opening OP partially exposing the anode electrode 181. The bank layer 118 may be made of an organic insulating material or an inorganic insulating material. For example, the bank layer 118 may include at least one of a photoresist, a polyimide resin, an acrylic resin, a silicon compound, a polyacrylic resin, and the like.

An organic light emitting layer 182 may be disposed on the upper surface of the anode electrode 181 and in the opening OP of the bank layer 118. A cathode electrode 183 may be disposed on the organic light emitting layer 182 and the bank layer 118. The cathode electrode 183 may be a common electrode disposed across a plurality of pixels.

The anode electrode 181 the organic light emitting layer 182, and the cathode electrode 183 may form an organic light-emitting element 180.

An encapsulation layer 190 may be disposed on the cathode electrode 183. The encapsulation layer 190 may cover the entirety of the organic light-emitting element 180. The encapsulation layer 190 may be a stack of inorganic layers and organic layers alternately stacked on one another. For example, the encapsulation layer 190 may include a first inorganic encapsulation layer 191, an organic encapsulation layer 192, and a second inorganic encapsulation layer 193 stacked on one another in this order along the thickness direction (the third direction, DR3).

Figure 8:
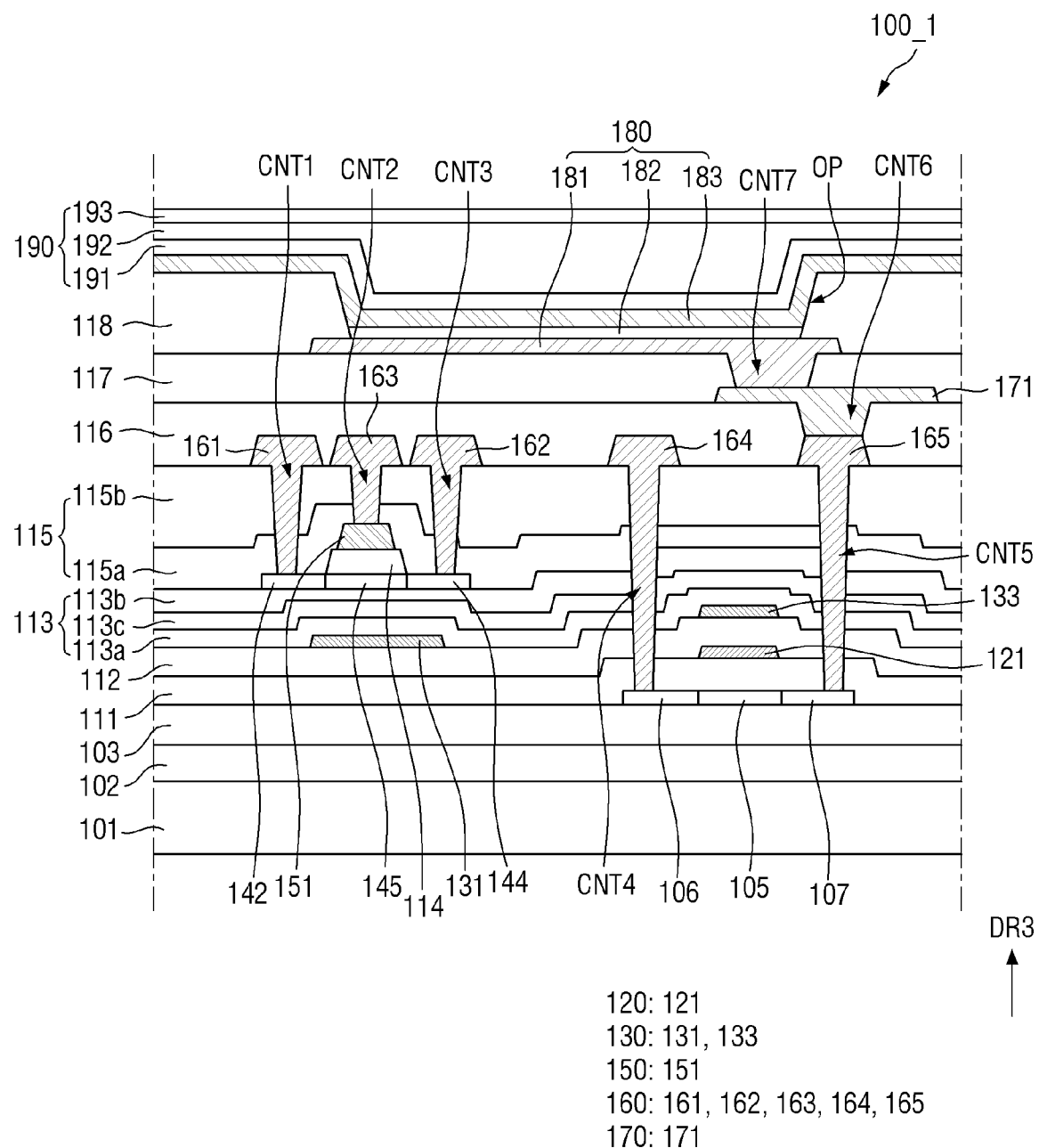
FIG. 8 is a cross-sectional view showing a display panel according to another example embodiment of the present disclosure.

FIG. 8 is a cross-sectional view showing a display panel according to another example embodiment of the present disclosure.

A display panel 100_1 according to the example embodiment of FIG. 8 is different from the display panel 100 of FIG. 4 in that a lower interlayer dielectric layer 113 further includes a third lower interlayer dielectric layer 113c between a first lower interlayer dielectric layer 113a and a second lower interlayer dielectric layer 113b.

More specifically, the display panel 100_1 according to this example embodiment may further include the third lower interlayer dielectric layer 113c between the first lower interlayer dielectric layer 113a and the second lower interlayer dielectric layer 113b.

According to this example embodiment, the hydrogen concentration of the third lower interlayer dielectric layer 113c may be lower than the hydrogen concentration of the first lower interlayer dielectric layer 113a.

According to the example embodiment of the present disclosure, in order to have different hydrogen concentrations of the third lower interlayer dielectric layer 113c and the first lower interlayer dielectric layer 113a, the third lower interlayer dielectric layer 113c and the first lower interlayer dielectric layer 113a may be formed with different ammonium flow rates when they are deposited by chemical vapor deposition.

According to this example embodiment, the lower interlayer dielectric layer 113 may further include a third lower interlayer dielectric layer 113c between the first lower interlayer dielectric layer 113a and the second lower interlayer dielectric layer 113b. Since the hydrogen concentration of the third lower interlayer dielectric layer 113c is less than the hydrogen concentration of the first lower interlayer dielectric layer 113a, it is possible to more effectively prevent hydrogen ions from penetrating from below the lower interlayer dielectric layer 113.

Hereinafter, the above-described example embodiments will be described in more detail with reference to Examples and Experimental Examples.

Preparation Example 1: Preparation of Silicon Nitride Layer

Substrate #1 was formed by stacking a silicon nitride layer on a glass substrate by the CVD to the thickness of 1,100 Å. The silicon nitride layer had the compressive stress of −434 MPa, the layer density of 2.58 g/cm$^3$, the composition ratio of nitrogen to silicon of 0.91, and the concentration of hydrogen of 1.24E+22 atoms/cm$^3$. Substrate #2 was prepared in the same manner as Substrate #1, except that the silicon nitride layer had the compressive stress of −104 MPa, the layer density of 2.49 g/cm$^3$, the composition ratio of nitrogen to silicon of 0.84, and the concentration of hydrogen is 1.26E+22 atoms/cm$^3$.

Experimental Example 1: Ion Current Measurement

The ion current was measured from the Substrate #1 and the Substrate #2 prepared in Preparation Example 1 for different temperatures. The ion current was measured using a TDS system, and the amount of outgas of hydrogen can be determined based on the ion current.

Figure 9:
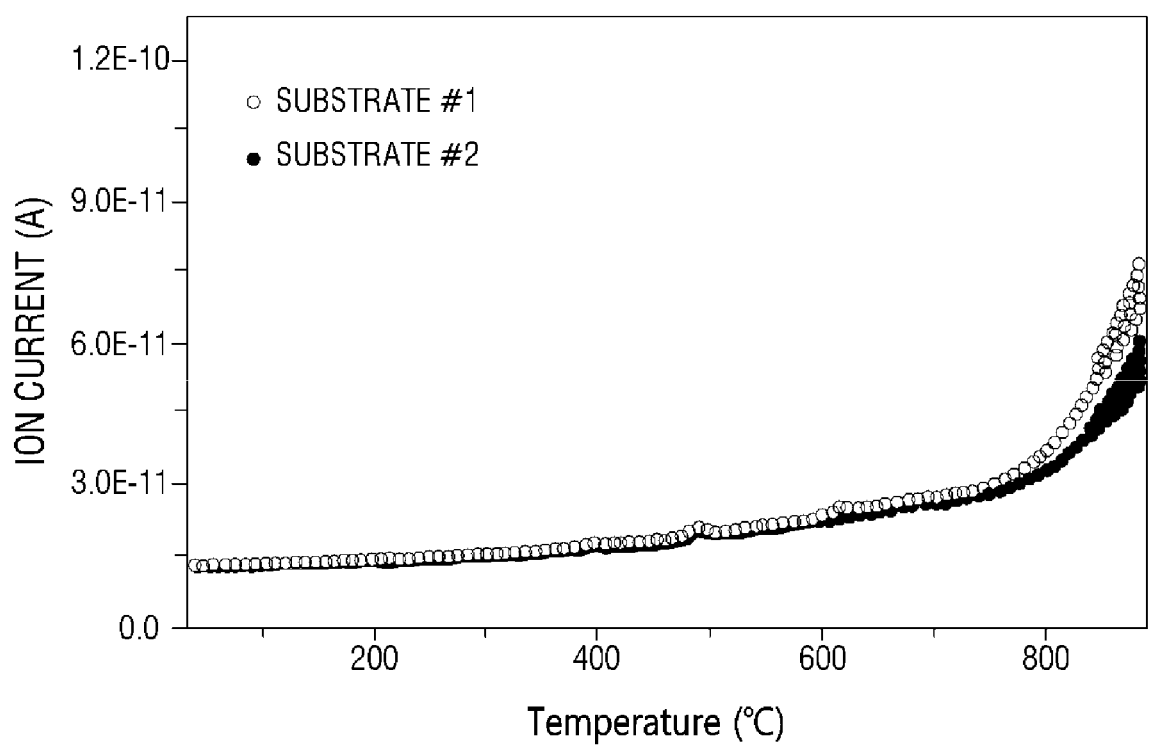
FIG. 9 is a graph showing ion currents of substrate #1 and substrate #2 versus temperature.
Figure 10:
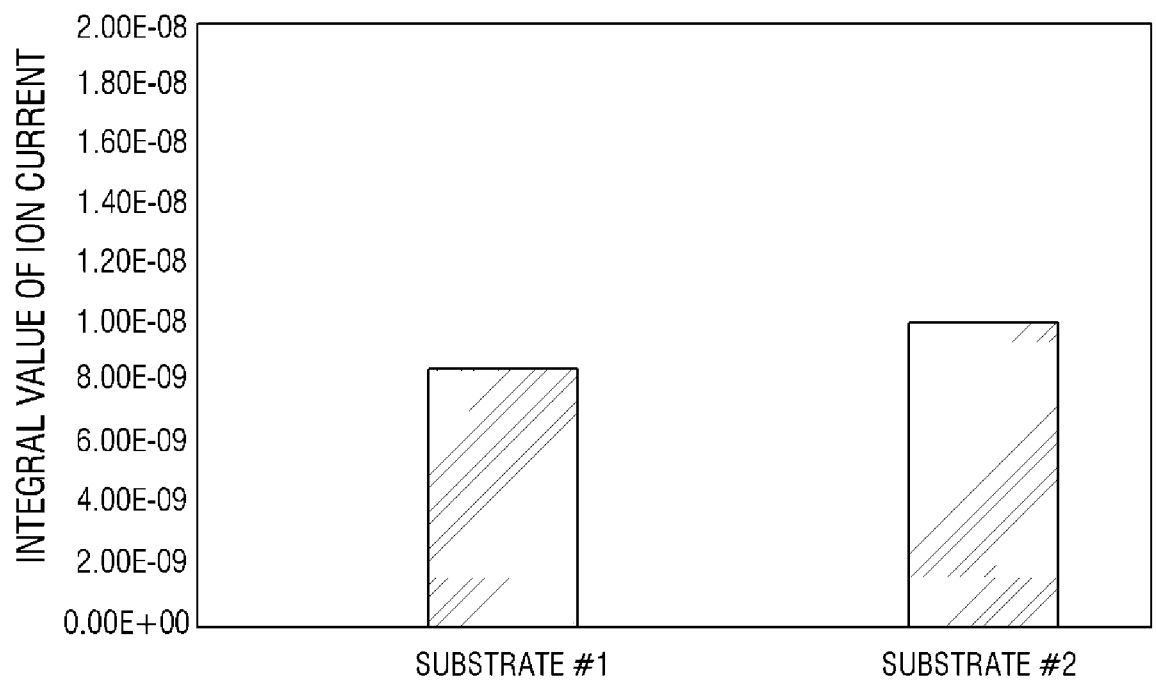
FIG. 10 is a chart showing the integral values of the ion currents of substrate #1 and substrate #2 for the entire temperature range.

FIG. 9 is a graph showing ion currents of Substrate #1 and Substrate #2 versus temperature. FIG. 10 is a chart showing the integral values of the ion currents of Substrate #1 and Substrate #2 for the entire temperature range.

The ion currents of Substrate #1 and Substrate #2 versus temperature, measured in Experimental Example 1, were shown in FIG. 9. The integral values of the ion currents are shown in FIG. 9. In FIG. 9, the horizontal axis represents temperature, the vertical axis represents the ion current. In FIG. 10, the horizontal axis represents Substrate #1 and Substrate #2, and the vertical axis represents the integral value of the ion currents.

As shown in FIG. 9, the ion currents of Substrate #1 and Substrate #2 increase gradually as the temperature increases, and are substantially equal to each other until approximately 760° C. As shown in FIG. 10, the integral values of the ion currents of Substrate #1 and Substrate #2 were similar. In view of the above, it could be seen that the amount of outgas of hydrogen in the silicon nitride layer of Substrate #1 and Substrate #2 was at the same level. This means that the characteristics of the switching transistor are at the same level when the switching transistors are formed on Substrate #1 and Substrate #2.

As a result, it was seen that the silicon nitride layer of Substrate #2 according to the example embodiment could exhibit equivalent characteristics of the switching transistor even if the compressive stress, the layer density and the composition ratio of nitrogen to silicon were lowered.

Preparation Example 2: Preparation of Lower Interlayer Dielectric Layer

Substrate #3 was formed by stacking a silicon nitride layer with the thickness of 3,000 Å on the silicon nitride layer of Substrate #1 by the CVD to prepare a lower interlayer dielectric layer. Substrate #4 was formed by stacking a silicon nitride layer with the thickness of 3,000 Å on the silicon nitride layer of Substrate #2 by the CVD to prepare a lower interlayer dielectric layer.

Experimental Example 2: Measuring Warpage of Substrate

The degree of warpage of the substrates was measured for Substrates #3 and #4 prepared in Preparation Example 2. The degree of warpage of the substrates was measured by placing the substrates on a flat platen and measuring the distance between the platen and the substrates at several points on the edge of the substrates.

FIG. 11 is a chart showing the degree of warpage of Substrates #3 and #4.

The degree of warpage of Substrates #3 and #4 was measured and shown in FIG. 11. In FIG. 11, the horizontal axis represents Substrate #3 and Substrate #4, and the vertical axis represents the distance between the platen and the substrates.

Referring to FIG. 11, the average distance between the platen and Substrate #3 was 538.18 mm, and the average distance between the platen and Substrate #4 was 528.02 mm.

In view of the above, it can be seen that the lower interlayer dielectric layer having the silicon nitride layer of Substrate #4 according to the example embodiment of the present disclosure can improve the warpage of the substrate by lowering the compressive stress, the layer density, and the composition ratio of nitrogen to silicon.

Preparation Example 3: Fabricating Transistor

Transistor #1 was fabricated by forming an IGZO semiconductor layer, a gate electrode, a source electrode and a drain electrode on Substrate #3. Transistor #2 was fabricated by forming an IGZO semiconductor layer, a gate electrode, a source electrode and a drain electrode on Substrate #4.

Experimental Example 3: Measuring I-V Curve of Transistor

The I-V curves for Transistors #1 and #2 prepared in Preparation Example 3 were measured and shown in FIG. 12.

FIG. 12 is a table showing the I-V curves for Transistors #1 and #2.

Referring to FIG. 12, Transistor #1 had the average threshold voltage of −0.19 V, the threshold voltage distribution of 1.21, the average on-current of 18.89 Å, and the on-current distribution of 12.47. Transistor #2 had the average threshold voltage of −0.07 V, the threshold voltage distribution of 0.81, the average on-current of 17.53 Å, and the on-current distribution of 9.36.

In view of the above, Transistor #2 formed on the lower interlayer dielectric layer having the silicon nitride layer of Substrate #4 according to the example embodiment exhibited better threshold voltage and on-current characteristics of the transistor even when the compressive stress, the layer density, and the composition ratio of nitrogen to silicon of the silicon nitride layer varied.

Experimental Example 4: Measuring Reliability of Transistors

The NBTS (negative bias temperature stress), AC stress and PBTS (positive bias temperature stress) of Transistor #1 and Transistor #2 prepared in Preparation Example 3 were measured.

Figure 14:
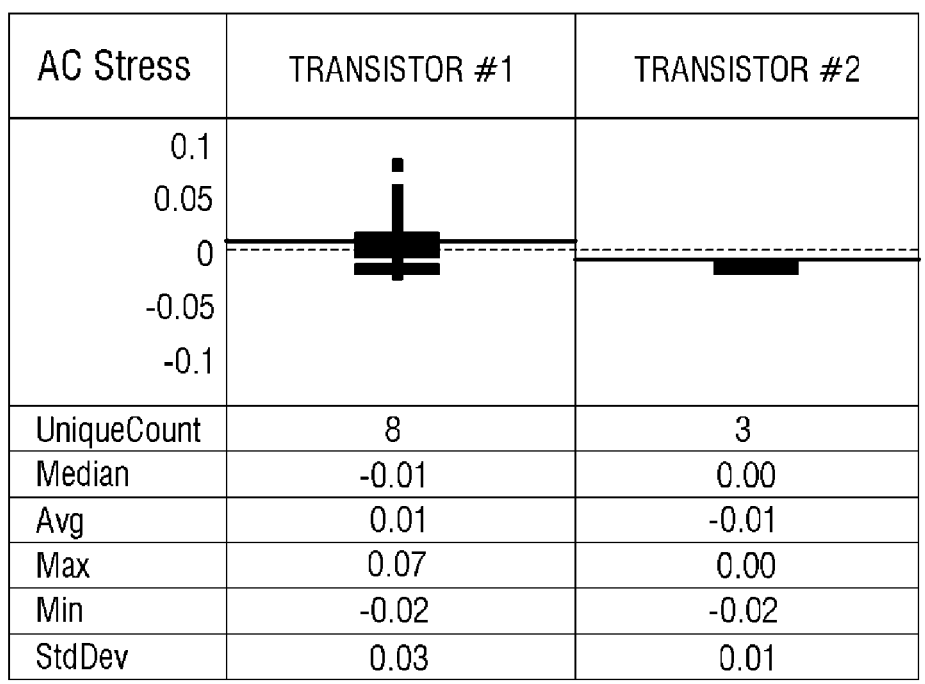
FIG. 14 is a table showing changes in the AC stress characteristics for Transistors #1 and #2.
Figure 16:
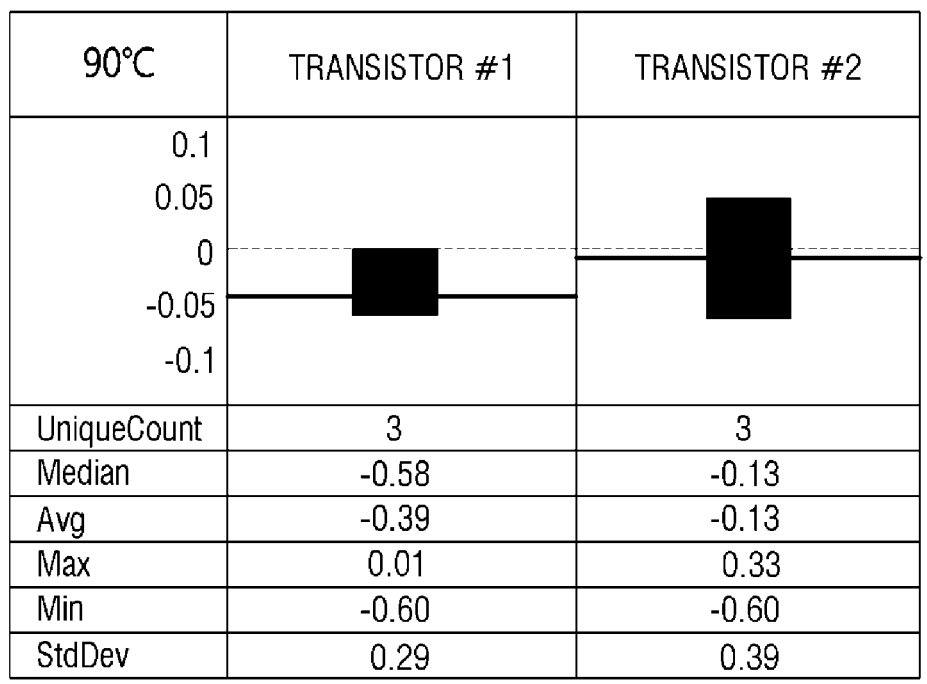
FIG. 16 is a table showing changes in the PBTS characteristics for Transistors #1 and #2 at 90° C.

FIG. 13 is a table showing changes in the NBTS characteristics for Transistors #1 and #2. FIG. 14 is a table showing changes in the AC stress characteristics for Transistors #1 and #2. FIG. 15 is a table showing changes in the PBTS characteristics for Transistors #1 and #2 at 70° C. FIG. 16 is a table showing changes in the PBTS characteristics for Transistors #1 and #2 at 90° C.

Referring to FIG. 13, the average threshold voltage of Transistor #1 was −0.01 V, and the average threshold voltage of Transistor #2 was −0.02 V.

Referring to FIG. 14, the average threshold voltage of Transistor #1 was −0.01 V, and the average threshold voltage of Transistor #2 was −0.01 V.

Referring to FIG. 15, the average threshold voltage of Transistor #1 was 0.13V, and the average threshold voltage of Transistor #2 was 0.19 V.

Referring to FIG. 16, the average threshold voltage of Transistor #1 was −0.39 V, and the average threshold voltage of Transistor #2 was −0.13 V.

That is to say, it can be seen that there was no significant difference in the reliability characteristics between Transistor #2 and Transistor #1.

In view of the above, Transistor #2 formed on the lower interlayer dielectric layer having the silicon nitride layer of Substrate #4 according to the example embodiment exhibited the equivalent reliability characteristics of the transistor even when the compressive stress, the layer density, and the composition ratio of nitrogen to silicon of the silicon nitride layer varied.

In concluding the detailed description, those skilled in the art will appreciate that many variations and modifications can be made to the preferred embodiments without substantially departing from the principles of the present disclosure. Therefore, the disclosed preferred embodiments of the disclosure are used in a generic and descriptive sense only and not for purposes of limitation.

What is claimed is:

1. A display device comprising:
a base substrate;
a lower interlayer dielectric layer disposed on the base substrate;
an oxide semiconductor layer disposed on the lower interlayer dielectric layer and including a first channel region, a first drain region disposed on a first side of the first channel region, and a first source region disposed on a second side of the first channel region opposite to the first side of the first channel region;
a first gate insulating layer disposed on the oxide semiconductor layer;
a first upper gate electrode disposed on the first gate insulating layer;
an upper interlayer dielectric layer disposed on the first upper gate electrode;
a first source electrode and a first drain electrode disposed on the upper interlayer dielectric layer;
a first lower gate electrode disposed between the base substrate and the oxide semiconductor layer;
a capacitor electrode disposed on a same first layer as the first lower gate electrode and spaced apart from the first lower gate electrode;
an upper gate insulating layer disposed between the capacitor electrode and the base substrate; and
a second gate electrode disposed between the upper gate insulating layer and the base substrate,
wherein the lower interlayer dielectric layer includes a first lower interlayer dielectric layer disposed on the base substrate and a second lower interlayer dielectric layer disposed on the first lower interlayer dielectric layer, wherein the first lower interlayer dielectric layer includes silicon nitride, and the second lower interlayer dielectric layer includes silicon oxide,
wherein a composition ratio of nitrogen to silicon in the first lower interlayer dielectric layer ranges from 0.8 to 0.89, and
wherein the second gate electrode underlaps the capacitor electrode.

2. The display device of claim 1, wherein the first lower interlayer dielectric layer has a layer density of 2.4 g/cm$^3$ to 2.57 g/cm$^3$, and
wherein the layer density is a density of the first lower interlayer dielectric layer comprising the silicon nitride.

3. The display device of claim 1, wherein a hydrogen concentration of the first lower interlayer dielectric layer is equal to or less than 1.26E+22 atoms/cm$^3$.

4. The display device of claim 1, wherein a compressive stress of the first lower interlayer dielectric layer ranges from −300 MPa to 0 MPa.

5. The display device of claim 1, wherein a thickness of the first lower interlayer dielectric layer ranges from 300 Å to 2,000 Å.

6. The display device of claim 5, wherein a thickness of the second lower interlayer dielectric layer ranges from 500 Å to 4,000 Å.

7. The display device of claim 6, wherein the thickness of the first lower interlayer dielectric layer is smaller than the thickness of the second lower interlayer dielectric layer.

8. The display device of claim 1, wherein the second lower interlayer dielectric layer is disposed directly on the first lower interlayer dielectric layer, and wherein the oxide semiconductor layer is disposed directly on the second lower interlayer dielectric layer.

9. The display device of claim 1, further comprising:
a first connection electrode disposed on the upper interlayer dielectric layer and connected to the first upper gate electrode,
wherein the first connection electrode is disposed on a same second layer as the first source electrode.

10. The display device of claim 9, wherein the first lower gate electrode underlaps the first upper gate electrode.

11. The display device of claim 10, further comprising:
a lower gate insulating layer disposed between the second gate electrode and the base substrate; and
a polycrystalline silicon semiconductor layer disposed between the lower gate insulating layer and the base substrate,
wherein the polycrystalline silicon semiconductor layer includes a second channel region underlapping the second gate electrode, a second drain region disposed on a first side of the second channel region, and a second source region disposed on a second side of the second channel region opposite to the first side of the second channel region.

12. The display device of claim 11, further comprising:
a second source electrode and a second drain electrode disposed on the same second layer as the first source electrode,
wherein the second source electrode is connected to the second source region, and the second drain electrode is connected to the second drain region.

13. The display device of claim 1, wherein the upper interlayer dielectric layer includes a first upper interlayer dielectric layer and a second upper interlayer dielectric layer disposed on the first upper interlayer dielectric layer.

14. The display device of claim 13, wherein the first upper interlayer dielectric layer comprises silicon oxide, and wherein the second upper interlayer dielectric layer comprises silicon nitride.

15. The display device of claim 14, wherein a hydrogen concentration of the first upper interlayer dielectric layer is smaller than a hydrogen concentration of the second upper interlayer dielectric layer.

16. A display device comprising:
a base substrate;
a lower interlayer dielectric layer disposed on the base substrate;
an oxide semiconductor layer disposed on the lower interlayer dielectric layer and comprising a first channel region, a first drain region disposed on a first side of the first channel region, and a first source region disposed on a second side of the first channel region opposite to the first side of the first channel region;
a first gate insulating layer disposed on the oxide semiconductor layer;
a first upper gate electrode disposed on the first gate insulating layer;
an upper interlayer dielectric layer disposed on the first upper gate electrode;
a first source electrode and a first drain electrode disposed on the upper interlayer dielectric layer;
a first lower gate electrode disposed between the base substrate and the oxide semiconductor layer;
a capacitor electrode disposed on a same layer as the first lower gate electrode and spaced apart from the first lower gate electrode;
an upper gate insulating layer disposed between the capacitor electrode and the base substrate; and
a second gate electrode disposed between the upper gate insulating layer and the base substrate,
wherein the lower interlayer dielectric layer comprises a first lower interlayer dielectric layer disposed on the base substrate, and a second lower interlayer dielectric layer disposed on the first lower interlayer dielectric layer,
wherein the first lower interlayer dielectric layer comprises silicon nitride and the second lower interlayer dielectric layer comprises silicon oxide,
wherein a layer density of the first lower interlayer dielectric layer ranges from 2.4 g/cm$^3$ to 2.57 g/cm$^3$,
wherein the layer density is a density of the first lower interlayer dielectric layer comprising the silicon nitride, and
wherein the second gate electrode underlaps the capacitor electrode.

17. The display device of claim 16, wherein a hydrogen concentration of the first lower interlayer dielectric layer is equal to or less than 1.26E+22 atoms/cm$^3$.

18. The display device of claim 16, wherein a compressive stress of the first lower interlayer dielectric layer ranges from −300 MPa to 0 MPa.

19. The display device of claim 16, wherein a thickness of the first lower interlayer dielectric layer ranges from 300 Å to 2,000 Å.

* * * * *